US012805312B2

(12) United States Patent
Li et al.

(10) Patent No.: US 12,805,312 B2
(45) Date of Patent: Nov. 17, 2026

(54) ELECTRONIC ASSEMBLIES AND METHODS OF MANUFACTURING THE SAME

(71) Applicant: Tesla, Inc., Austin, TX (US)

(72) Inventors: Yong guo Li, Gilroy, CA (US); Rishabh Bhandari, San Carlos, CA (US); Aydin Nabovati, Toronto (CA); Vijaykumar Krithivasan, Mountain View, CA (US); William Chang, Mountain View, CA (US)

(73) Assignee: Tesla, Inc., Austin, TX (US)

( * ) Notice: Subject to any disclaimer, the term of this patent is extended or adjusted under 35 U.S.C. 154(b) by 445 days.

(21) Appl. No.: 18/576,230

(22) PCT Filed: Jun. 28, 2022

(86) PCT No.: PCT/US2022/035264
§ 371 (c)(1),
(2) Date: Jan. 3, 2024

(87) PCT Pub. No.: WO2023/283076
PCT Pub. Date: Jan. 12, 2023

(65) Prior Publication Data

US 2024/0312863 A1 Sep. 19, 2024

Related U.S. Application Data

(60) Provisional application No. 63/219,205, filed on Jul. 7, 2021.

(51) Int. Cl.
*H10W 40/22* (2026.01)
*H10W 40/00* (2026.01)
*H10W 40/60* (2026.01)

(52) U.S. Cl.
CPC ......... *H10W 40/22* (2026.01); *H10W 40/037* (2026.01); *H10W 40/60* (2026.01)

(58) Field of Classification Search
CPC ... H10W 40/22; H10W 40/037; H10W 40/60; H05K 7/20454; H05K 7/209
See application file for complete search history.

(56) References Cited

U.S. PATENT DOCUMENTS 5,757,620 A * 5/1998 Edwards ............... H10W 40/70 257/713
6,665,187 B1 * 12/2003 Alcoe ................... H10W 40/10 257/E23.101

(Continued)

FOREIGN PATENT DOCUMENTS

JP 05-206180 8/1993
JP 11-026659 1/1999

(Continued)

OTHER PUBLICATIONS

International Search Report and Written Opinion dated Oct. 25, 2022 in International Application No. PCT/US2022/035264.

*Primary Examiner* — Victor A Mandala
(74) *Attorney, Agent, or Firm* — Knobbe, Martens, Olson & Bear, LLP

(57) ABSTRACT

Wafer assemblies and related methods of manufacture are disclosed. Such assemblies and methods can account for different heights of electronic modules positioned on a wafer. In an embodiment, a wafer assembly includes a cooling system, a wafer, a first electronic module, a second electronic module, and a height adjustment structure. A first thermal interface material (TIM) can be disposed between the first electronic module and a first portion of the cooling system. A second TIM can be disposed between the second electronic module and a second portion of the cooling system. The height adjustment structure can compensate for a height difference between the first electronic module and (Continued)

the second electronic module. Other wafer assemblies and methods of manufacture are disclosed.

20 Claims, 13 Drawing Sheets

(56) References Cited

U.S. PATENT DOCUMENTS

| | | | | |
|---|---|---|---|---|
| 6,724,631 | B2 * | 4/2004 | Ye | H05K 1/141 257/E23.101 |
| 6,960,825 | B2 * | 11/2005 | Mamitsu | H10W 40/611 257/E23.092 |
| 7,031,162 | B2 * | 4/2006 | Arvelo | H10W 40/22 257/713 |
| 8,111,516 | B2 | 2/2012 | Goldrian et al. | |
| 10,580,717 | B2 * | 3/2020 | Liu | H10W 40/037 |
| 10,887,982 | B2 | 1/2021 | Nasr et al. | |
| 11,122,678 | B2 | 9/2021 | Zhao et al. | |
| 11,894,770 | B2 | 2/2024 | Sun et al. | |
| 2003/0128518 | A1 * | 7/2003 | Gaynes | H10W 40/22 257/713 |
| 2005/0068739 | A1 * | 3/2005 | Arvelo | H10W 40/22 257/E23.09 |
| 2006/0039118 | A1 * | 2/2006 | Jafari | H10W 40/43 361/719 |
| 2006/0091530 | A1 * | 5/2006 | Wang | H10W 40/70 257/E25.023 |
| 2007/0000647 | A1 | 1/2007 | Crocker et al. | |
| 2007/0268673 | A1 | 11/2007 | Ankireddi | |
| 2008/0142954 | A1 * | 6/2008 | Hu | H10W 90/00 257/713 |
| 2008/0266786 | A1 * | 10/2008 | Jafari | H10W 40/43 361/679.48 |
| 2009/0116197 | A1 * | 5/2009 | Funakoshi | H10W 40/037 438/122 |
| 2009/0127700 | A1 * | 5/2009 | Romig | H10W 40/22 257/E23.101 |
| 2011/0013363 | A1 | 1/2011 | Goldrian et al. | |
| 2013/0258599 | A1 * | 10/2013 | Danello | H10W 40/77 361/706 |
| 2014/0002989 | A1 * | 1/2014 | Ahuja | G06F 1/20 361/679.54 |
| 2014/0090816 | A1 | 4/2014 | Yang et al. | |
| 2014/0264821 | A1 * | 9/2014 | Tang | B29C 39/10 257/713 |
| 2015/0001701 | A1 * | 1/2015 | Li | H05K 1/0204 257/713 |
| 2017/0186665 | A1 | 6/2017 | Choudhury et al. | |
| 2017/0372979 | A1 * | 12/2017 | Gandhi | H10W 40/22 |
| 2018/0374776 | A1 | 12/2018 | Liu et al. | |
| 2019/0267306 | A1 | 8/2019 | Raravikar et al. | |
| 2019/0348340 | A1 * | 11/2019 | Kwon | H10W 40/22 |
| 2020/0091030 | A1 * | 3/2020 | Kwon | H10W 40/037 |
| 2020/0194332 | A1 | 6/2020 | Ahuja et al. | |
| 2020/0235083 | A1 * | 7/2020 | Kwon | H10W 40/10 |
| 2020/0266705 | A1 | 8/2020 | Sun et al. | |
| 2020/0329551 | A1 * | 10/2020 | Yamamoto | F28F 13/00 |
| 2020/0381336 | A1 * | 12/2020 | Otsubo | H05K 9/00 |
| 2020/0411405 | A1 * | 12/2020 | Kim | H10P 54/00 |
| 2021/0057354 | A1 * | 2/2021 | Eid | B33Y 80/00 |
| 2021/0249322 | A1 * | 8/2021 | Lin | H10W 40/22 |
| 2024/0222349 | A1 * | 7/2024 | Nakahara | H10W 40/22 |

FOREIGN PATENT DOCUMENTS

| | | |
|---|---|---|
| JP | 2001-118984 | 4/2001 |
| JP | 2004-056126 | 2/2004 |
| JP | 2015-146385 | 8/2015 |
| TW | 200943440 | 10/2009 |
| WO | WO 2020/061330 | 3/2020 |
| WO | WO 22/133448 | 6/2022 |

* cited by examiner

ELECTRONIC ASSEMBLIES AND METHODS OF MANUFACTURING THE SAME

CROSS-REFERENCE TO RELATED APPLICATION

This application is a U.S. national phase application under 35 U.S.C. § 371 of International Application No. PCT/US2022/035264, titled "ELECTRONIC ASSEMBLIES AND METHODS OF MANUFACTURING THE SAME," and filed Jun. 28, 2022, which claims the benefit of U.S. Provisional Patent Application No. 63/219,205, titled "ELECTRONIC ASSEMBLIES AND METHODS OF MANUFACTURING THE SAME," filed Jul. 7, 2021, the disclosures of each of which are incorporated herein by reference in their entireties and for all purposes.

TECHNICAL FIELD

The present disclosure relates generally to electronic assemblies and methods of manufacturing the same.

BACKGROUND

A system on a wafer (SoW) assembly can include a SoW and a heat dissipation structure coupled to the SoW. Voltage regulating modules (VRMs) and a thermal interface material can be included between the heat dissipation structure and the SoW. When the SoW and the heat dissipation structure are bonded together, a significant pressure is applied.

SUMMARY OF CERTAIN INVENTIVE ASPECTS

In one aspect, a wafer assembly is disclosed. The assembly includes a cooling system, a wafer, a first electronic module, a second electronic module, and a height adjustment structure. The first electronic module is mounted on a first location of the wafer and coupled to a first portion of the cooling system. The first electronic module and the first portion of the cooling system are positioned such that a first thermal interface material (TIM) is disposed between the first electronic module and the first portion of the cooling system. The second electronic module is mounted on a second location of the wafer different from the first location and coupled to a second portion of the cooling system. The second electronic module and the second portion of the cooling system are positioned such that a second TIM is disposed between the second electronic module and the second portion of the cooling system. The height adjustment structure is disposed between the first location of the wafer and the first portion of the cooling system. The height adjustment structure is configured to compensate for a height difference between the first electronic module and the second electronic module.

In one embodiment, the first electronic module is a voltage regulating module (VRM).

In one embodiment, the height adjustment structure includes a crown that is disposed on the first electronic module.

In one embodiment, the height adjustment structure includes a protrusion extending from the first portion of the cooling system.

In one embodiment, the assembly further includes a second height adjustment structure that is disposed between the second location of the wafer and the second portion of the cooling system. A height of the second height adjustment structure is different from a height of the first height adjustment structure.

In one embodiment, the height adjustment structure includes part of the first TIM.

In one embodiment, the assembly further includes a heat dissipation structure that is positioned such that the wafer is located between the cooling system and the heat dissipation structure.

In one aspect, a wafer assembly is disclosed. The assembly includes a wafer that has a center region and an edge region around the center region. The assembly includes a plurality of electronic modules that have different heights mounted on the wafer such that an average height of a first group of electronic modules of the plurality of electronic modules located within the center region is greater than an average height of a second group of electronic modules of the plurality of electronic modules located within the edge region. The assembly includes a cooling system that is coupled to the plurality of electronic modules. The cooling system and the plurality of electronic modules are positioned such that a thermal interface material (TIM) is disposed between the cooling system and the plurality of electronic modules. The wafer is curved such that the edge region of the wafer is closer to the cooling system than the center region of the wafer.

In one embodiment, the first group of electronic modules have heights that are greater than height of the second group of electronic modules.

In one embodiment, the assembly further includes a heat dissipation structure that is positioned such that the wafer is located between the cooling system and the heat dissipation structure.

In one embodiment, the plurality of electronic modules include a plurality of voltage regulating modules (VRMs).

In one aspect, a method of manufacturing wafer assemblies is disclosed. The method includes selecting a first group of electronic modules and a second group of electronic modules from a plurality of electronic modules such that a height variation of the first group of electronic modules and a height variation of the second group of electronic modules are both less than a height variation of the plurality of electronic modules. The method includes mounting the first group of electronic modules on a first wafer and the second group of electronic modules on a second wafer. The method includes coupling a first cooling system and the first group of electronic modules such that a first thermal interface material is positioned between the first cooling system and the first group of electronic modules. The method includes coupling a second cooling system and the second group of electronic modules such that a second thermal interface material is positioned between the second cooling system and the second group of electronic modules.

In one embodiment, the plurality of electronic modules include a plurality of voltage regulating modules (VRMs).

In one embodiment, the first wafer includes integrated circuit dies aligned with corresponding ones of the first group of electronic modules.

In one embodiment, the height variation of the first group of electronic modules and the height variation of the second group of electronic modules are each less than half of the height variation of the plurality of electronic modules.

In one embodiment, the coupling the first cooling system and the first group of electronic modules includes applying force to the cooling system to compress the first thermal interface material.

In one embodiment, the method further includes providing a first heat dissipation structure such that the first wafer is positioned between the first cooling system and the first heat dissipation structure.

In one embodiment, the method further includes securing the first heat dissipation structure and the first cooling system with a first fastener, and securing a second heat dissipation structure and the second cooling system with a second fastener. The second fastening is longer than the first fastener.

In one embodiment, the method further includes selecting a third group of electronic modules from the plurality of electronic modules such that a height variation of the third group of electronic modules is less than the height variation of the plurality of electronic modules, mounting the third group of electronic modules on a third wafer, and coupling a third cooling system and the third group of electronic modules such that a third thermal interface material is positioned between the third cooling system and the third group of electronic modules.

In one embodiment, mounting the first group of electronic modules on the first wafer includes mounting a first sub-group of the first group of electronic modules within a center region of the first wafer, and mounting a second sub-group of the first group of electronic modules within an edge region of the first wafer that is around the center region. The first sub-group of electronic modules has an average height that is greater than an average height of the second sub-group of electronic modules. The wafer is curved such that the edge region is spaced apart from the cooling system by a smaller distance than the center region.

BRIEF DESCRIPTION OF THE DRAWINGS

Specific implementations will now be described with reference to the following drawings, which are provided by way of example, and not limitation.

DETAILED DESCRIPTION OF CERTAIN EMBODIMENTS

Figure 1:
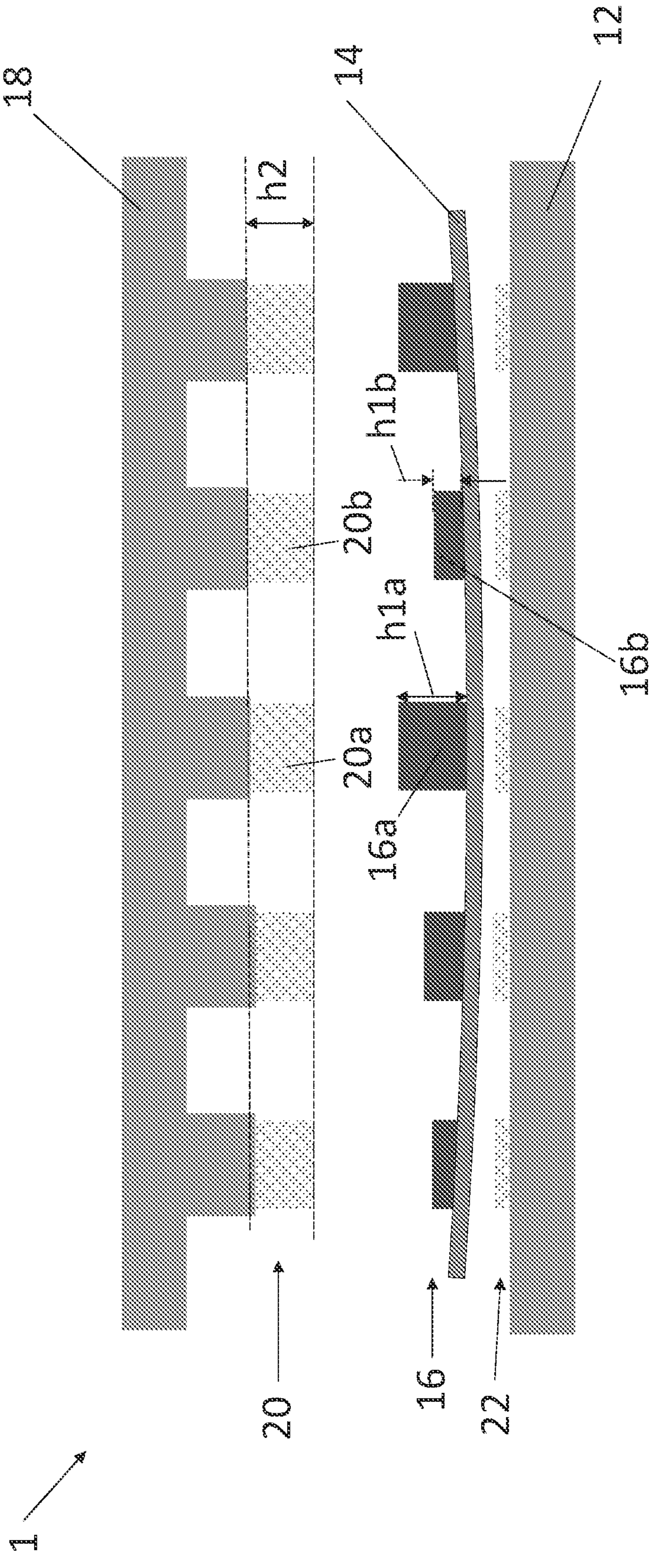
FIG. 1 shows a schematic cross sectional side view of a system on a wafer (SoW) assembly prior to coupling a cooling system with VRMs on a SoW.

The following detailed description of certain embodiments presents various descriptions of specific embodiments. However, the innovations described herein can be embodied in a multitude of different ways, for example, as defined and covered by the claims. In this description, reference is made to the drawings where like reference numerals and/or terms can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

System on a wafer (SoW) assemblies can include a SoW and a cooling system that is coupled to the SoW. The SoW can include an array of integrated circuit dies. The SoW can be sensitive to an external force. The SoW and the heat dissipation structure can include an array of electronic modules, such as voltage regulating modules (VRMs), positioned therebetween. A thermal interface material (TIM) can be positioned between the VRMs and the heat dissipation structure. A pressure can be applied to couple the SoW and the heat dissipation structure. When the VRMs have different heights, uneven TIM compression can result in the SoW experiencing uneven force, which can damage the SoW. Certain VRMs have a relatively large variation in height. Reducing or eliminating uneven TIM compression associated with such VRMs can reduce the risk of wafer stress and strain.

Embodiments disclosed herein relate to SoW assemblies that compensate or otherwise account for height differences between a plurality of VRMs and methods for manufacturing the same. Such embodiments can prevent and/or mitigate the risk of a sensitive element (e.g., SoW) in the SoW assemblies from being damaged due to uneven pressure applied during assembly. Certain embodiments disclosed herein relate to a SoW assembly that includes a SoW, a heat dissipation structure, a TIM, and a height adjustment structure. The height adjustment structure can be included on or with an electronic module. Alternatively or additionally, the height adjust structure can be included on or with a cooling system. The height adjustment structure can compensate for height differences among the electronic modules, such as VRMs. Some embodiments disclosed herein relate to a SoW assembly that includes a plurality of VRMs having different heights that are arranged so as to reduce a risk of the SoW being damaged from uneven pressure on the SoW. Certain embodiments disclosed herein relate to a method of manufacturing SoW assemblies, each of which having VRMs with corresponding heights within a certain range so as to reduce uneven pressure applied to the SoW. Such methods can involve binning VRMs by height and using different groups of VRMs in different SoW assemblies with fasteners having different fastener heights that correspond to VRM heights.

Figure 2:
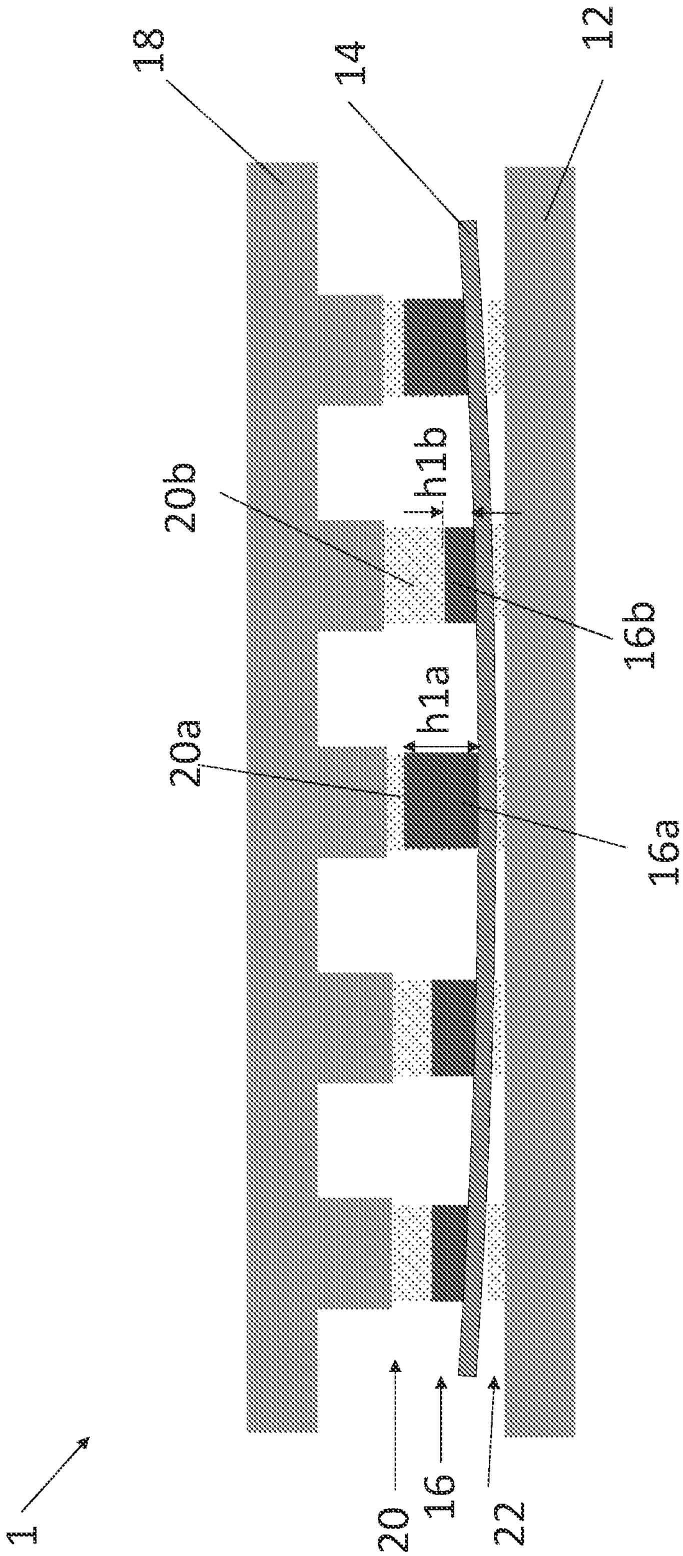
FIG. 2 shows a schematic cross sectional side view of the SoW assembly of FIG. 1 after coupling the cooling system with the VRMs.

FIG. 1 shows a schematic cross sectional side view of a system on a wafer (SoW) assembly 1 prior to coupling a cooling system 18 with VRMs 16 on a SoW 14. FIG. 2 shows a schematic cross sectional side view of the SoW assembly 1 after coupling the cooling system 18 with the VRMs 16. As illustrated in FIGS. 1 and 2, the SoW assembly 1 includes a heat dissipation structure 12, the SoW 14, the VRMs 16, the cooling system 18, a TIM 20, and a TIM 22.

The SoW assembly 1 includes the TIM 20 between the cooling system 18 and the VRMs 16. The TIM 20 can improve thermal conductivity between the cooling system 18 and the VRMs 16. The TIM 20 can provide adhesion between the cooling system 18 and the VRMs 16. As shown in FIG. 1, the TIM 20 can be provided with the cooling system 18.

The SoW 14 and the heat dissipation structure 12 can be coupled together as shown in FIG. 2. The TIM 22 can be provided between the heat dissipation structure 12 and the SoW 14. The heat dissipation structure 12 can dissipate heat from the SoW 14. The heat dissipation structure 12 can include a heat spreader. Such a heat spreader can include a metal plate. Alternatively or additionally, the heat dissipation structure 12 can include a heat sink. The heat dissipation structure 12 can include metal, such as copper and/or aluminum.

The SoW 14 can include an array of integrated circuit (IC) dies. The IC dies can be embedded in a molding material. The IC dies can be semiconductor dies, such as silicon dies. The array of IC dies can include any suitable number of IC dies. For example, the array of IC dies can include 16 IC dies, 25 IC dies, 36 IC dies, or 49 IC dies. The SoW 14 can be an Integrated Fan-Out (InFO) wafer, for example. InFO wafers can include a plurality of routing layers over an array of IC dies. For example, an InFO wafer can include 4, 5, 6, 8, or 10 routing layers in certain applications. The routing layers of the InFO wafer can provide signal connectivity between the IC dies and/or to external components.

The VRMs 16 can be positioned such that each VRM is stacked with an IC die of the SoW 14. In certain applications, the VRMs 16 can consume significant power. The VRMs 16 can be configured to receive a direct current (DC) supply voltage and supply a lower output voltage to a corresponding IC die of the SoW 14.

The VRMs 16 can each have a height. For example, a VRM 16*a* has a height h1*a* and a VRM 16*b* has a height h1*b*. The VRMs 16 can have different heights due to, for example, manufacturing tolerances. An average height difference among the VRMs 16 can be about +/−300 microns. An average difference among the VRMs 16 can be about +/−10% of the height of the tallest one 16*a* of the VRMs 16 in the SoW assembly 1, such as in a range from about 8% to 12% of the height of the tallest VRM 16*a*. Prior to coupling the cooling system 18, the VRMs 16, and the SoW 14 together, the TIM 20 at each VRM 16 can have the same or generally similar height h2. When the cooling system 18 and the SoW 14 are brought together, the tallest VRM 16*a* of the VRMs 16 can make contact with a corresponding TIM 20*a* first, and the shortest VRM 16*b* of the VRMs 16 can make contact with a corresponding TIM 20*b* last. As the cooling system 18 gets compressed against the SoW 14 to make the contacts between the VRMs 16 and the TIM 20, the TIM 20*a* at the tallest VRM 16*a* of the VRMs 16 experiences increased compression force. The compression force can be transferred through the VRM 16 to the SoW 14, which can apply uneven pressure to the SoW that can damage the SoW 14. In some cases, a portion of the SoW that contacts the tallest VRM 16*a* may experience significantly higher compression force than a portion of the SoW that contacts the shortest VRM 16*b* such that the portion of the SoW that contacts the tallest VRM 16*a* can be damaged. In some cases, after the SoW 14 and the cooling system 18 are coupled together, the TIM 20*a* may have a higher density than the TIM 20*b*, and/or the TIM 20*a* may have a footprint that is greater than a footprint of the TIM 20*b*.

As shown in FIGS. 1 and 2, the SoW 14 can have a warped or curved shape. With such curvature, outer edges of the SoW 14 are positioned farther from the heat dissipation structure 12 than the middle part of the SoW 14. Therefore, when the VRMs 16 have the same heights, a top surface of a VRM of the VRMs 16 can be below a top surface of another VRM of the VRMs 16, and during a coupling process, one or more of the VRMs 16 can make contact with corresponding one or more of the TIM 20 before the rest of the VRMs 16. As the cooling system 18 is pressed against the SoW 14 to make the contacts between the VRMs 16 and the TIM 20, the VRM with the top surface above other VRMs can experience increased compression force. The compression force can be transferred through the VRM 16 to the SoW 14, which can damage the SoW 14. In other words, during a coupling process for coupling the cooling system 18 with the VRMs 16 on the SoW 14, the height differences among the VRMs 16 can cause uneven distribution of compression force to the SoW 14 and can damage the SoW 14.

The cooling system 18 can comprise any suitable heat dissipation structure. The cooling system 18 can provide active cooling for the VRMs 16. Active cooling can involve coolant, such as liquid coolant, flowing through the cooling system 18. The cooling system 18 can include metal with flow paths for heat transfer fluid to flow through. As one example, the cooling system 18 can include machined metal, such as copper. The cooling system 18 can include one or more brazed fin arrays for high cooling efficiency. In a fully assembled SoW assembly 1, the cooling system 18 can be bolted to the heat dissipation structure 12. Bolting the cooling system 18 and the heat dissipation structure 12 can provide structural support for the SoW 14 and/or can reduce the chance of the SoW 14 breaking.

Figure 3:
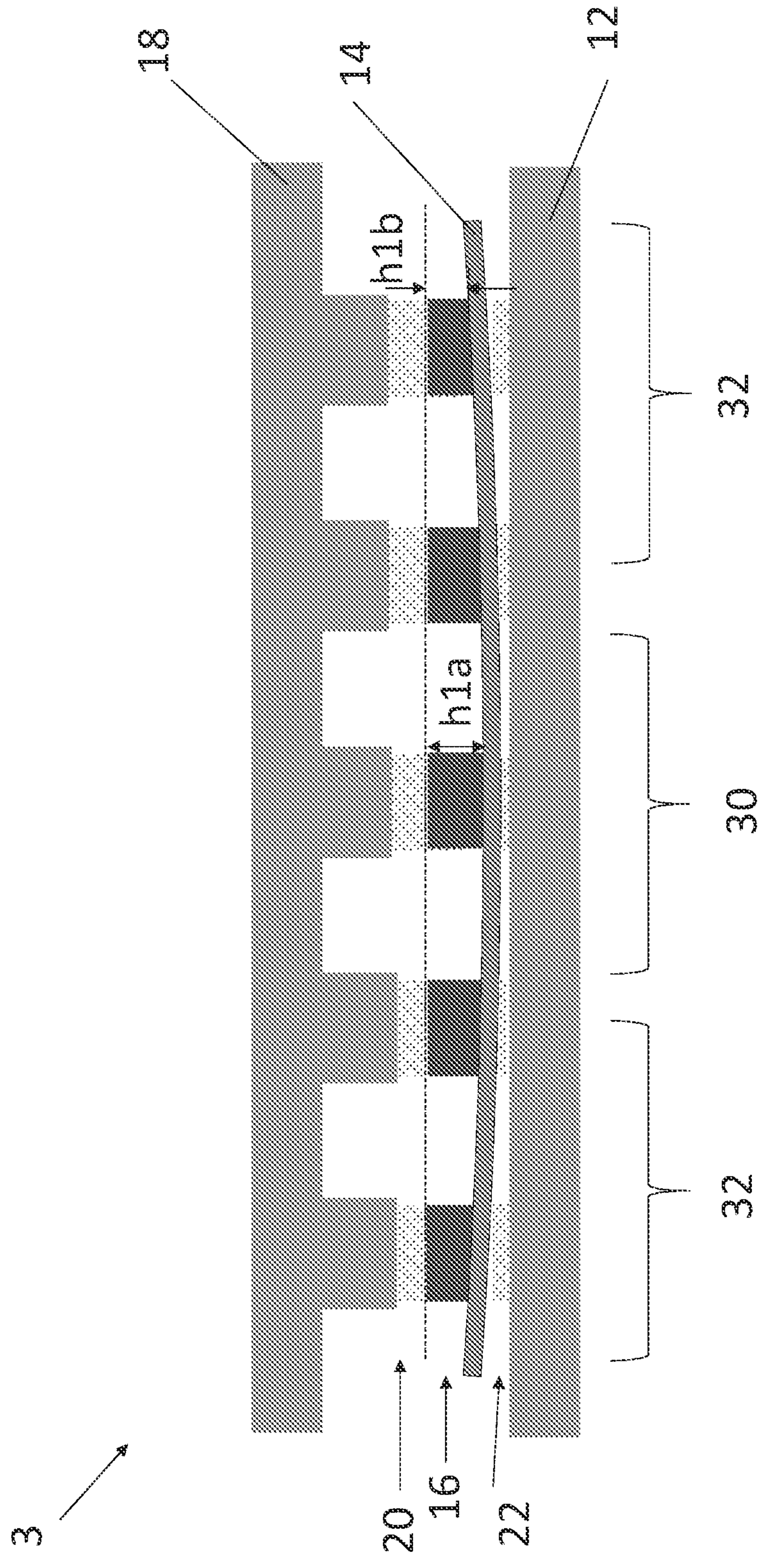
FIG. 3 is a schematic cross sectional side view of a SoW assembly according to an embodiment.

FIG. 3 is a schematic cross sectional side view of a system on a wafer (SoW) assembly 3 according to an embodiment. In this embodiment, VRMs are binned such that VRMs 16 with similar heights to each other are used in the SoW assembly 3. Taller VRMs are positioned in a center region 30 of the SoW 14 to account for curvature of the SoW 14. Unless otherwise noted, components of the SoW assembly 3 of FIG. 3 can be the same as or generally similar to like components of any SoW assembly disclosed herein.

The SoW assembly 3 can include a heat dissipation structure 12 and a SoW 14 positioned over the heat dissipation structure 12. The heat dissipation structure 12 and the SoW 14 can have a TIM 22 therebetween. The SoW assembly 3 can include the VRMs 16 positioned over the SoW 14, and a cooling system 18 positioned over the VRMs 16. The VRMs 16 and the cooling system 18 can have a TIM 20 therebetween.

The VRMs 16 are selected and positioned on the SoW 14 such that taller VRMs are positioned near a center region 30 of the SoW 14 and shorter VRMs are positioned near an edge region 32 of the SoW 14 so as to compensate for the warped or curved shape of the SoW 14. As shown in FIG. 3 with a dashed line, upper surfaces of the VRMs 16 are at the same or generally similar height relative to each other. Therefore, when a force is applied to couple the cooling system 18 and the SoW 14 together, generally uniform, equal, or almost equal compression force can be applied to each one of the VRMs 16 and each corresponding TIM 20. Such generally uniform, equal, or almost equal compression force can mitigate the risk of the SoW 14 being damaged from coupling the cooling system 18 to the SoW 14. Though the VRMs 16 are positioned on the SoW 14 in the illustrated embodiments, the VRMs 16 can be positioned over any suitable carrier or wafer other than the SoW 14.

Figure 4A:
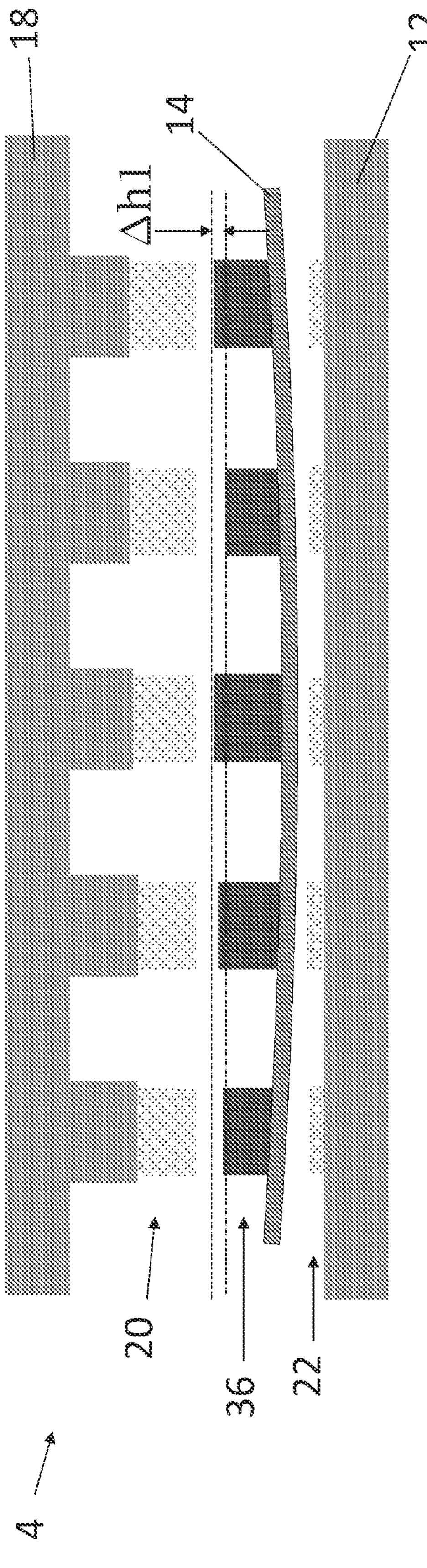
FIG. 4A shows a schematic cross sectional side view of a SoW assembly prior to coupling a cooling system with a first group of VRMs on a SoW, according to an embodiment.
Figure 4B:
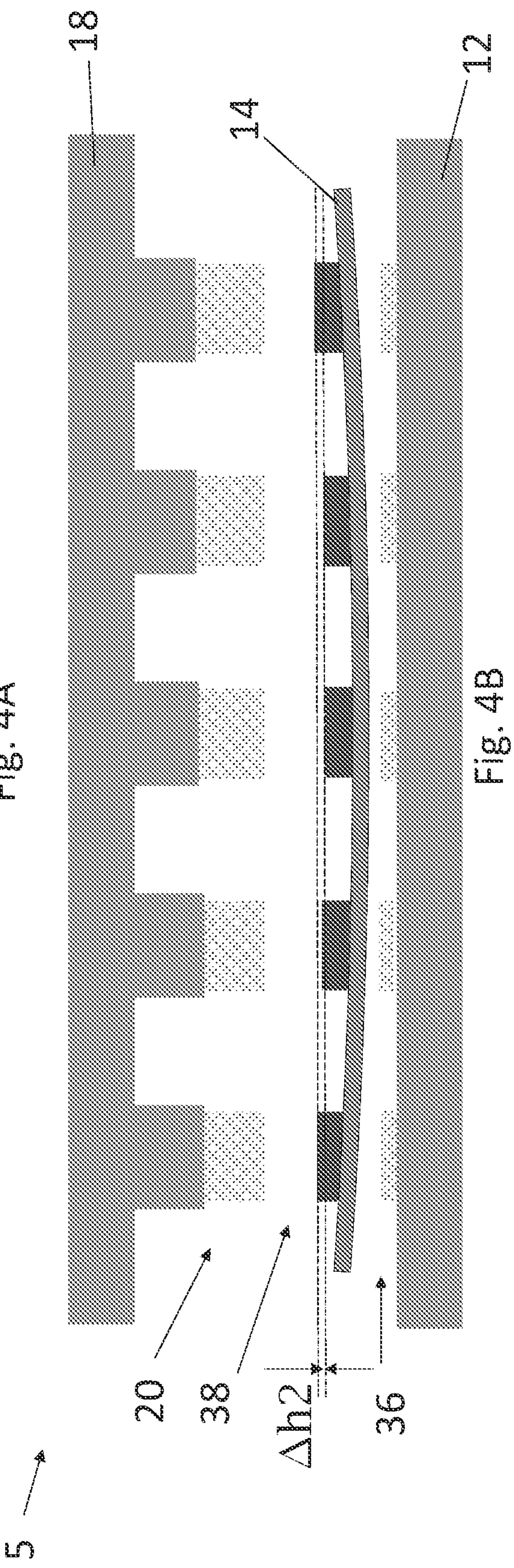
FIG. 4B shows a schematic cross sectional side view of a SoW assembly prior to coupling a cooling system with a second group of VRMs on a SoW, according to another embodiment.
Figure 4C:
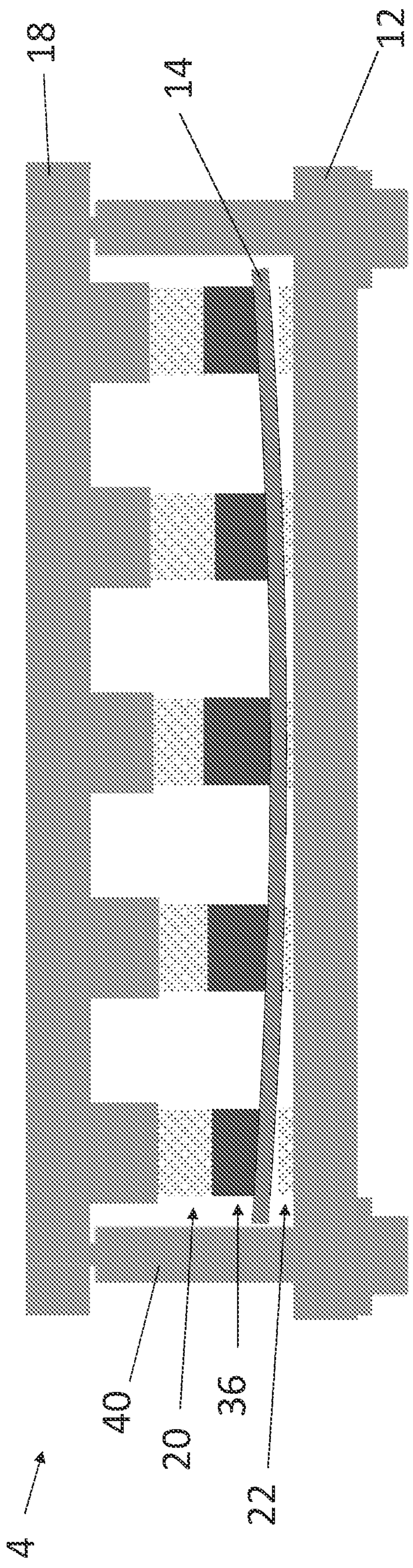
FIG. 4C shows a schematic cross sectional side view of the SoW assembly of FIG. 4A after coupling the cooling system with the first group of VRMs on the SoW.
Figure 4D:
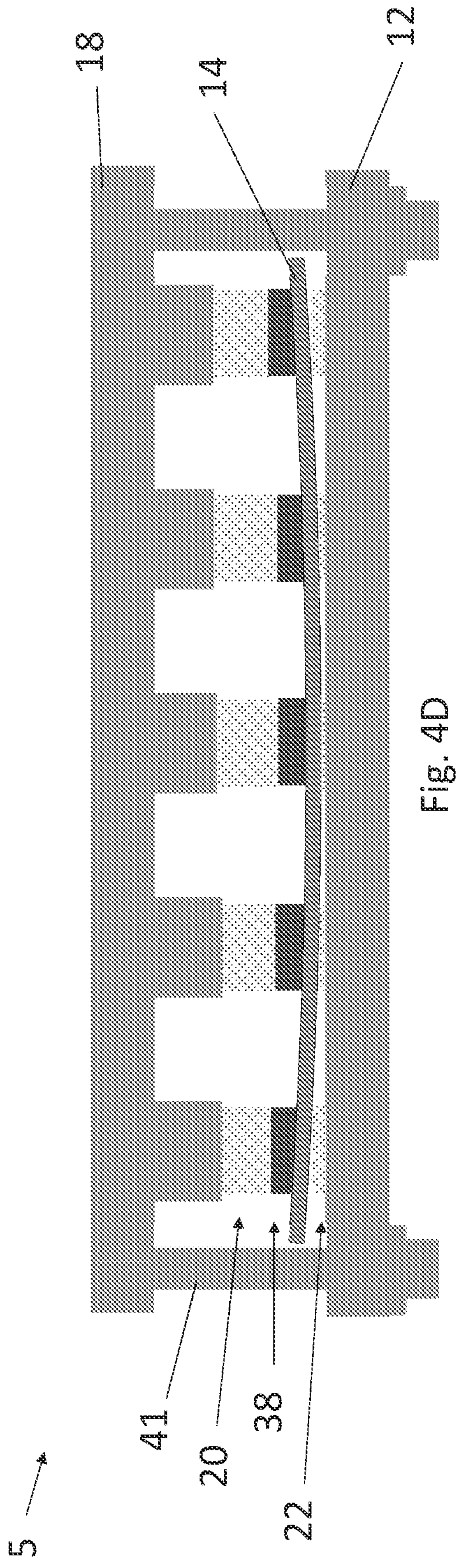
FIG. 4D shows a schematic cross sectional side view of the SoW assembly of FIG. 4B after coupling the cooling system with the second group of VRMs on the SoW.

FIG. 4A shows a schematic cross sectional side view of a SoW assembly 4 prior to coupling a cooling system 18 with a first group of VRMs 36 on a SoW 14, according to an embodiment. FIG. 4B shows a schematic cross sectional side view of a SoW assembly 5 prior to coupling a cooling system 18 with a second group of VRMs 38 on a SoW 14, according to an embodiment. FIG. 4C shows a schematic cross sectional side view of the SoW assembly 4 after coupling the cooling system 18 with the first group of VRMs 36 on the SoW 14. FIG. 4D shows a schematic cross sectional side view of the SoW assembly 5 after coupling the cooling system 18 with the second group of VRMs 38 on the SoW 14. FIGS. 4A to 4D illustrate that VRMs with height variation can be binned into groups by height. The different groups can then be used in different SoW assemblies with different sized fasteners. With such binning, the height variation of VRMs of a particular SoW assembly can be significantly lower than the highest variation of all of the VRMs of the different SoW assemblies. While FIGS. 4A to 4B illustrate SoWs associated with two different groups of VRMs binned by height, VRMs can be binned into any suitable number of groups to reduce height variation of groups of VRMs in each SoW assembly. Unless otherwise noted, components of the SoW assemblies 4, 5 of FIGS. 4A-4D can be the same as or generally similar to like components of any SoW assembly disclosed herein.

The SoW assembly 4 and the SoW 5 can each include a heat dissipation structure 12 and a SoW 14 positioned over the heat dissipation structure 12. The heat dissipation structure 12 and the SoW 14 can be intervened by a TIM 22. The SoW assembly 4 can include the first group of VRMs 36 positioned over the SoW 14, and a cooling system 18 positioned over the first group of VRMs 36. A TIM 20 can be positioned between the first group of VRMs 36 and the cooling system 18. The SoW assembly 5 can include the second group of VRMs 38 positioned over the SoW 14, and a cooling system 18 positioned over the second group of VRMs 38. A TIM 20 can be positioned between the second group of VRMs 38 and the cooling system 18.

VRMs can be binned into a first group of VRMs 36 and a second group of VRMs 38 based on height of the VRMs. The first group of VRMs 36 and the second group of VRMs 38 can be selected from a plurality of VRMs such that the group of VRMs 36 and the second group of VRMs 38 each have height differences or tolerances smaller than a height difference or tolerance among the plurality of VRMs. In some embodiments, three or more groups of VRMs can be selected from the plurality of VRMs. For example, a third group of VRMs to n-th group of VRMs can also be selected, where n is an integer 4 or greater.

In some embodiments, the plurality of VRMs can have an average height difference of x, and n groups of VRMs can be selected from the plurality of VRMs. In such embodiments, each group of the n groups of VRMs may have an average VRM height difference that is less than about x/n. For instance, with the plurality of VRMs binned into two groups, the height difference among each group can be less than about ½ of the height difference for the plurality of VRMs. As another example, with the plurality of VRMs binned into three groups, the height difference among each group can be less than about ⅓ of the height difference for the plurality of VRMs.

As an example, heights of VRMs can vary by about 20%. With N groups of VRMs, the variation of heights among VRMs of an individual group can be within 20%/N. For example, with 2 groups of VRMs, each group can have a height variation within about 10% of VRM height. As another example, with 4 groups of VRMs, each group can have a height variation within about 5% of VRM height.

In some embodiments, a height of each VRM of the plurality of VRMs can be measured and a first number of VRMs from the tallest ones of the plurality of VRMs can be selected as the first group of VRMs 36 and a second number of VRMs 38 from the shortest ones of the plurality of VRMs can be selected as the second group pf VRMs 38. A VRM height difference can be caused during manufacture of the VRMs. Each VRM can include a passive portion that has passive component layers, and an active portion that has two or more active component layers. The passive portion and the active portion can both have manufacturing tolerances. These manufacturing tolerances can be additive.

As shown in FIGS. 4A and 4B, height differences among the first group of VRMs 36 and height differences among the second group of VRMs 38 can be relatively small. An average height difference among the first group of VRMs 36 and an average height difference among the second group of VRMs 38 can be smaller than an average height difference of a larger group that includes both the first and second groups of VRMs 36, 38. In some embodiments, the average height difference among the first group of VRMs 36 and the average height difference among the second group of VRMs 38 can be about a half of the average height difference among a group that includes both the first and second groups of VRMs 36, 38. In some embodiments, the average height tolerance of the first group of VRMs 36 and the average height tolerance of the second group of VRMs 38 can be within a particular value determined based at least in part on a compression force applied to coupling the cooling system 18 with the first and second groups of VRMs 36, 38.

The heat dissipation structure 12, the SoW 14, and the cooling system 18 can be coupled together by way of a fastener 40, 41. In some embodiments, the fastener 40, 41 can comprise a bolt, such as a shoulder bolt. The fastener 40, 41 can extend through a portion of the heat dissipation structure 12 and a portion of the cooling system 18. A spacing between the heat dissipation structure 12 and the cooling system 18 in the SoW assembly 4 can be greater than a spacing between the heat dissipation structure 12 and the cooling system 18 in the SoW assembly 5. The fastener 40 in the SoW assembly 4 can be longer than the fastener 41 in the SoW assembly 5. The longer fastener 40 can accommodate the taller VRMs 36. On the other hand, the shorter fastener 41 can accommodate the shorter VRMs 38.

Various embodiments of SoW assemblies disclosed herein can include a height adjustment structure. In some embodiments, a height adjustment structure can be a crown positioned between a cooling system and a SoW (see FIGS. 5A-5C), a protrusion extending from a cooling system and positioned between the cooling system and a SoW (see FIGS. 6A and 6B), and at least part of a TIM positioned between a cooling system and a SoW and having a different thickness than another TIM (see FIG. 8). The height adjustment structure can compensate for a height difference between a first VRM and a second VRM. The crown can be positioned on the first VRM. The total height of the first VRM and the crown to be the same as or similar to the second VRM (or a total height of the second VRM and another crown on the second VRM). The protrusion can extend from the cooling system and be positioned between the first VRM and the cooling system. The total height of the first VRM and the protrusion can be the same as or similar to the second VRM (or a total height of the second VRM and another protrusion). The crown and/or the protrusion can reduce a difference in a thickness between different TIMs in the SoW assembly. The height adjustment structure can enable, when a force is applied to couple the cooling system and the SoW together, generally uniform, equal, or almost equal compression force to be applied to each one of the VRMs and each corresponding TIM in the SoW assembly. In some embodiments, the height adjustment structure can enable the TIMs positioned between VRMs and a cooling system to have the same or similar footprints. In some embodiments, the height adjustment structure can prevent or mitigate excessive increase of a footprint of a TIM during a process of coupling the SoW 14 and the cooling system 18.

Figure 5A:
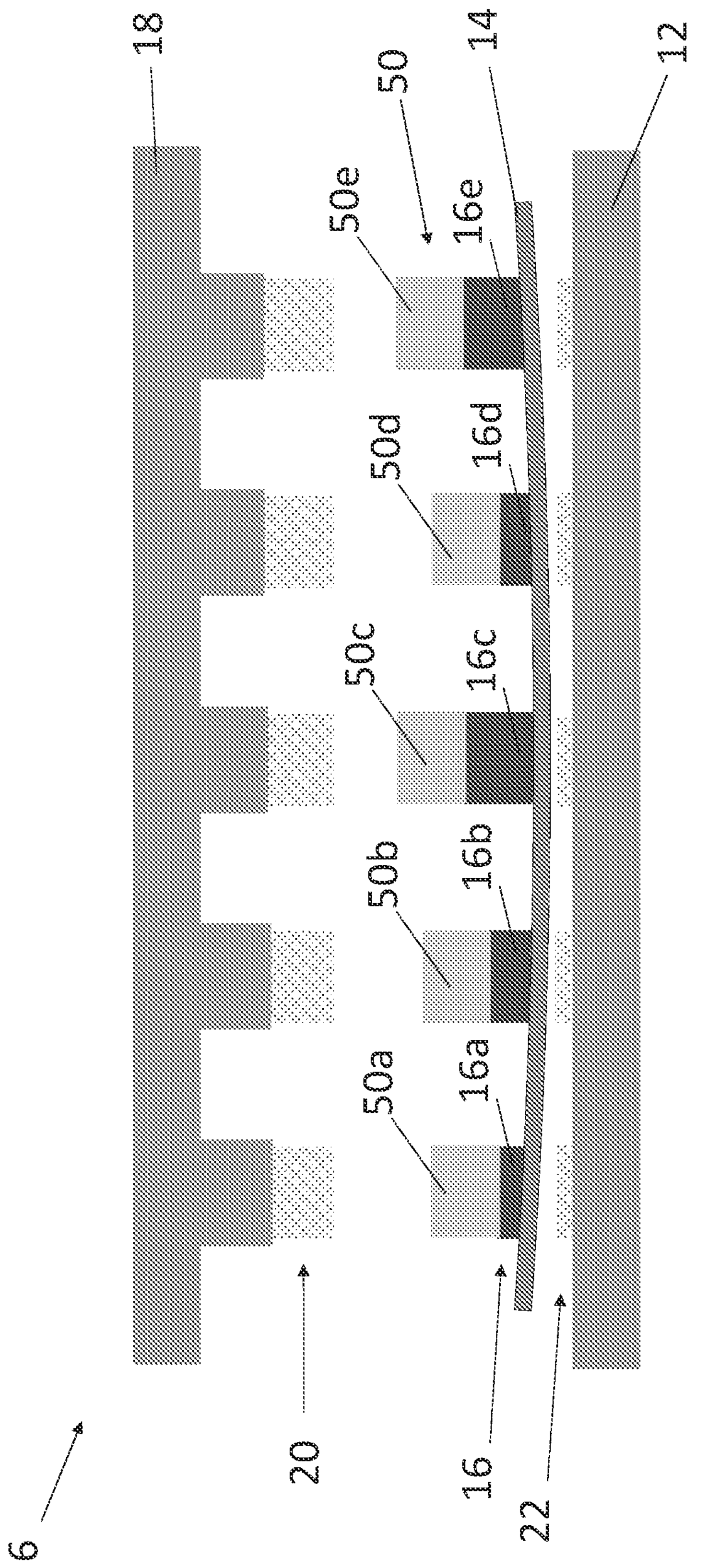
FIG. 5A shows a schematic cross sectional side view of a SoW assembly having a height adjustment structure prior to thinning the height adjustment structure, according to an embodiment.
Figure 5B:
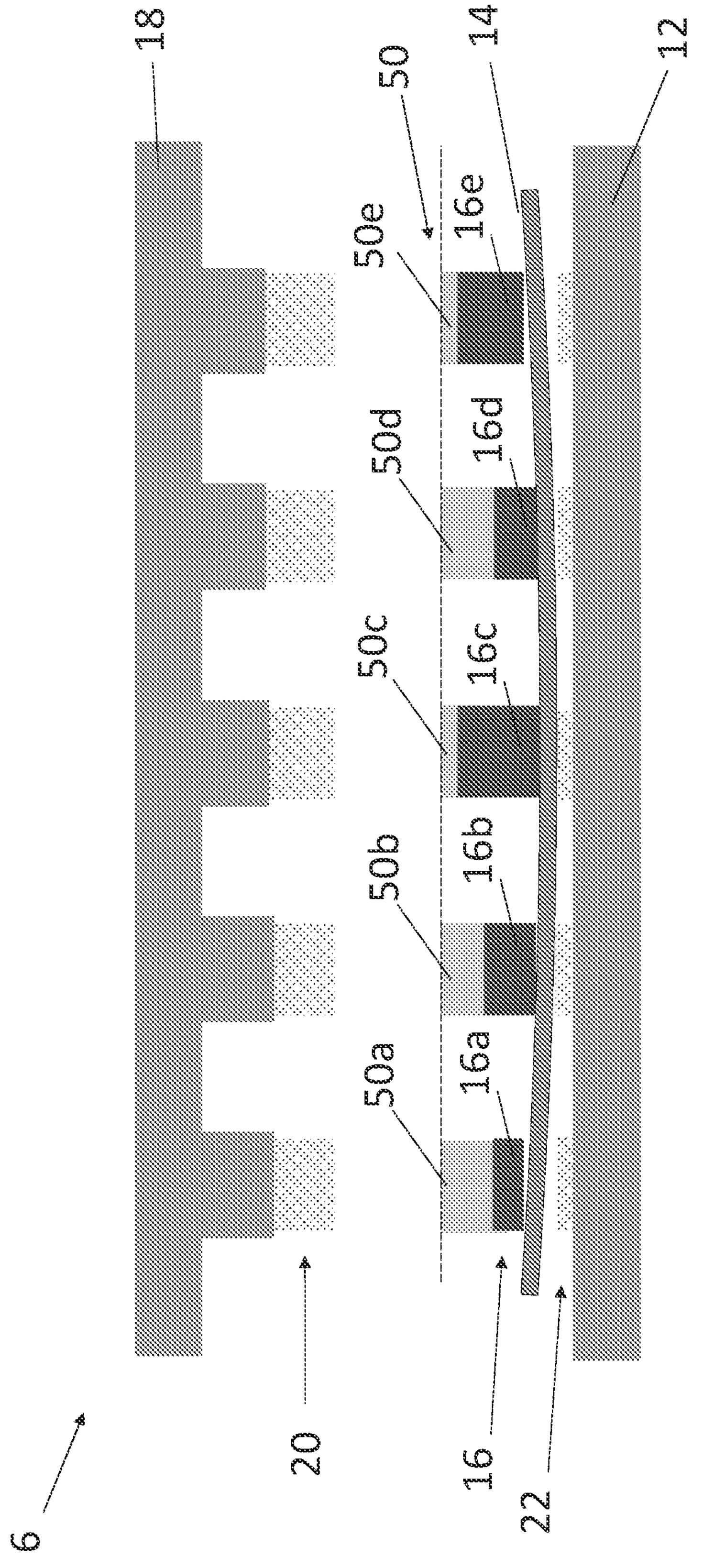
FIG. 5B shows a schematic cross sectional side view of SoW assembly of FIG. 5A after thinning the height adjustment structure and prior to coupling a cooling system with VRMs on a SoW.
Figure 5C:
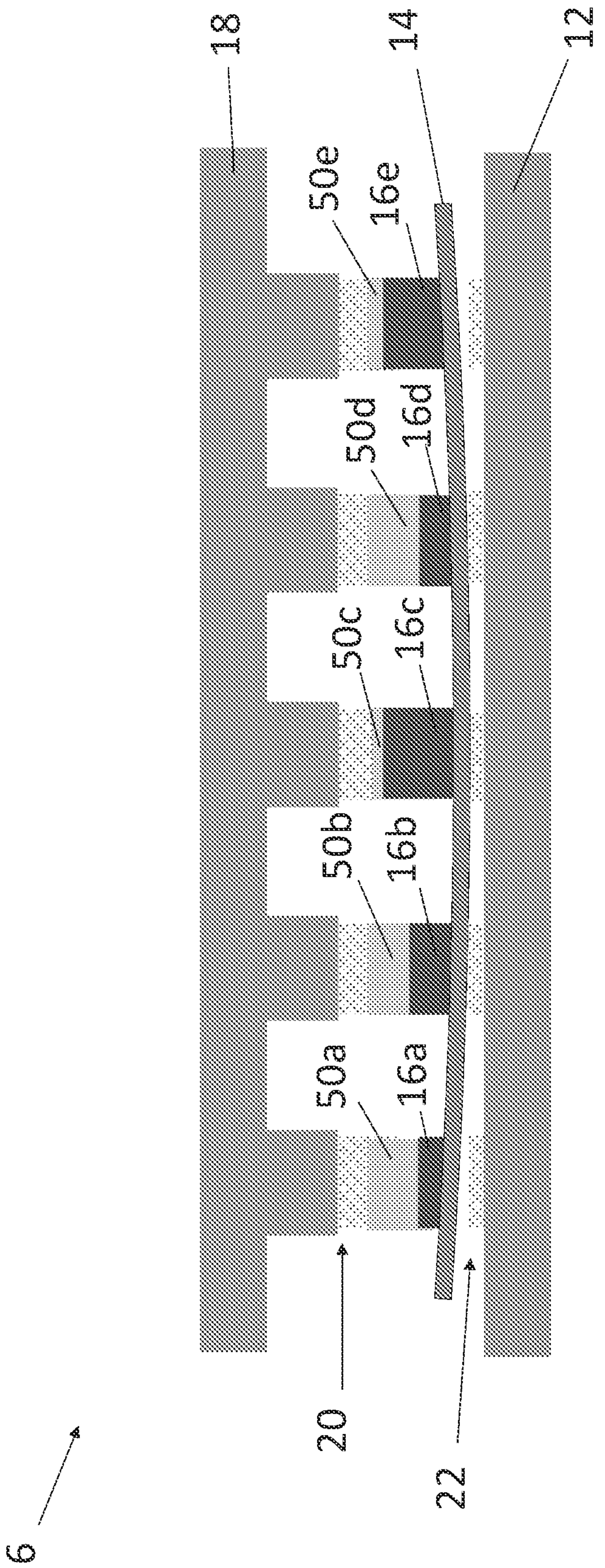
FIG. 5C shows a schematic cross sectional side view of the SoW assembly of FIG. 5B after coupling the cooling system with the VRMs on the SoW.

FIG. 5A shows a schematic cross sectional side view of a SoW assembly 6 having a height adjustment structure 50 (e.g., a crown) prior to thinning the height adjustment structure 50, according to another embodiment. FIG. 5B shows a schematic cross sectional side view of the SoW assembly 6 after thinning the height adjustment structure 50 and prior to coupling a cooling system 18 with VRMs 16 on a SoW 14. FIG. 5C shows a schematic cross sectional side view of the SoW assembly 6 after coupling the cooling system 18 with the VRMs 36 on the SoW 14. FIGS. 5A to 5C illustrate features of an embodiment where a height adjustment structure 50 is added to the VRMs 16 to compensate for variation in VRM height. Unless otherwise noted, components of the SoW assembly 6 of FIGS. 5A-5C can be the same as or generally similar to like components of any SoW assembly disclosed herein.

The SoW assembly 6 can include a heat dissipation structure 12 and the SoW 14 positioned over the heat dissipation structure 12. The heat dissipation structure 12 and the SoW 14 can have a TIM 22 positioned therebetween. The SoW assembly 6 can include the VRMs 16 positioned over the SoW 14, and the cooling system 18 positioned over the VRMs 16. The VRMs 16 and the cooling system 18 can have a TIM 20 positioned therebetween. The height adjustment structure 50 can be positioned between the cooling system 18 and the SoW 14. The height adjustment structure 50 can compensate for a height difference between VRMs 16. With the height adjustment structure 50, a more even force can be applied when coupling the cooling system 18 and the SoW 14. The height adjustment structure 50 can reduce a difference in thickness between TIM 20 between different VRMs 16 and the cooling system 18 due to equalizing compression force during manufacture.

The height adjustment structure 50 can comprise first to fifth crowns **50*a*-50*e* that are respectively positioned on first to fifth VRMs 16*a*-16*e* of the VRMs 16, in the illustrated embodiment. However, the height adjustment structure 50 can be positioned under the VRMs 16, between the TIM 20 and the cooling system 18, or any other suitable locations. The height adjustment structure 50 can comprise a material with a relatively high thermal conductivity. For example, the height adjustment structure 50 can have the same or generally similar thermal conductivity as the TIM 20 in certain applications. The material of the height adjustment structure 50 can be different from the material of the TIM 20. A non-functional structure on functional circuit elements of a VRM 16** can be referred to as a crown, whether the non-functional structure is integrated with or separate from the functional circuit elements.

In FIG. 5A, the first to fifth crowns **50*a*-50*e* can be provided over the first to fifth VRMs 16*a*-16*e* that have different heights. Because the first to fifth crowns 50*a*-50*e* in FIG. 5A have the same or generally similar heights, the total heights of the first crown 50*a* and the first VRM 16*a*, the second crown 50*b* and the second VRM 16*b*, the third crown 50*c* and the second VRM 16*c*, the fourth crown 50*d* and the fourth VRM 16*d*, and the fifth crown 50*e* and the fifth VRM 16*e*** can be different.

In FIG. 5B, portions of the first to fifth crowns **50*a*-50*e* can be removed to make the total heights of the first crown 50*a* and the first VRM 16*a*, the second crown 50*b* and the second VRM 16*b*, the third crown 50*c* and the second VRM 16*c*, the fourth crown 50*d* and the fourth VRM 16*d*, and the fifth crown 50*e* and the fifth VRM 16*e* equal or generally equal to each other. After removing the portions of the first to fifth crowns 50*a*-50*e*, relative heights of upper surfaces of the first to fifth crowns 50*a*-50*e* can be the same or generally similar. In other words, the height adjustment structure 50 can compensate for at least the VRM height differences to generally match the spacings for the TIM 20 between the cooling system 18 and the height adjustment structure 50. The height adjustment structure 50 can also account for curvature of the SoW 14**.

The cooling system 18 can be coupled with the VRMs 36 on the SoW 14 as shown in FIG. 5C. When the heat dissipation structure 12 and the cooling system 18 of the SoW assembly 6 are brought together to be coupled to one another, generally uniform, equal, or almost equal compression force can be applied to each one of the first to fifth VRMs **16*a*-16*e*, the first to fifth crowns 50*a*-50*e*, and each corresponding TIM 20. Such generally uniform, equal, or almost equal compression force can mitigate risks of the SoW 14 being damaged from coupling the cooling system 18 to the SoW 14**.

In some embodiments, the height adjustment structure 50 can be omitted from one or more of the tallest VRM(s) of the first to fifth VRMs **16*a*-16*e*. In some embodiments, the height of the first to fifth crowns 50*a*-50*e* can be determined based at least in part on the height differences between the heights of the first to fifth VRMs 16*a*-16*e*. For example, a height of a crown positioned over a VRM can be at least the difference between a height of the tallest VRM and a height of the VRM. Warpage or curvature of a wafer of the SoW 14** can also be taken into account when determining the heights of the crowns.

Figure 6A:
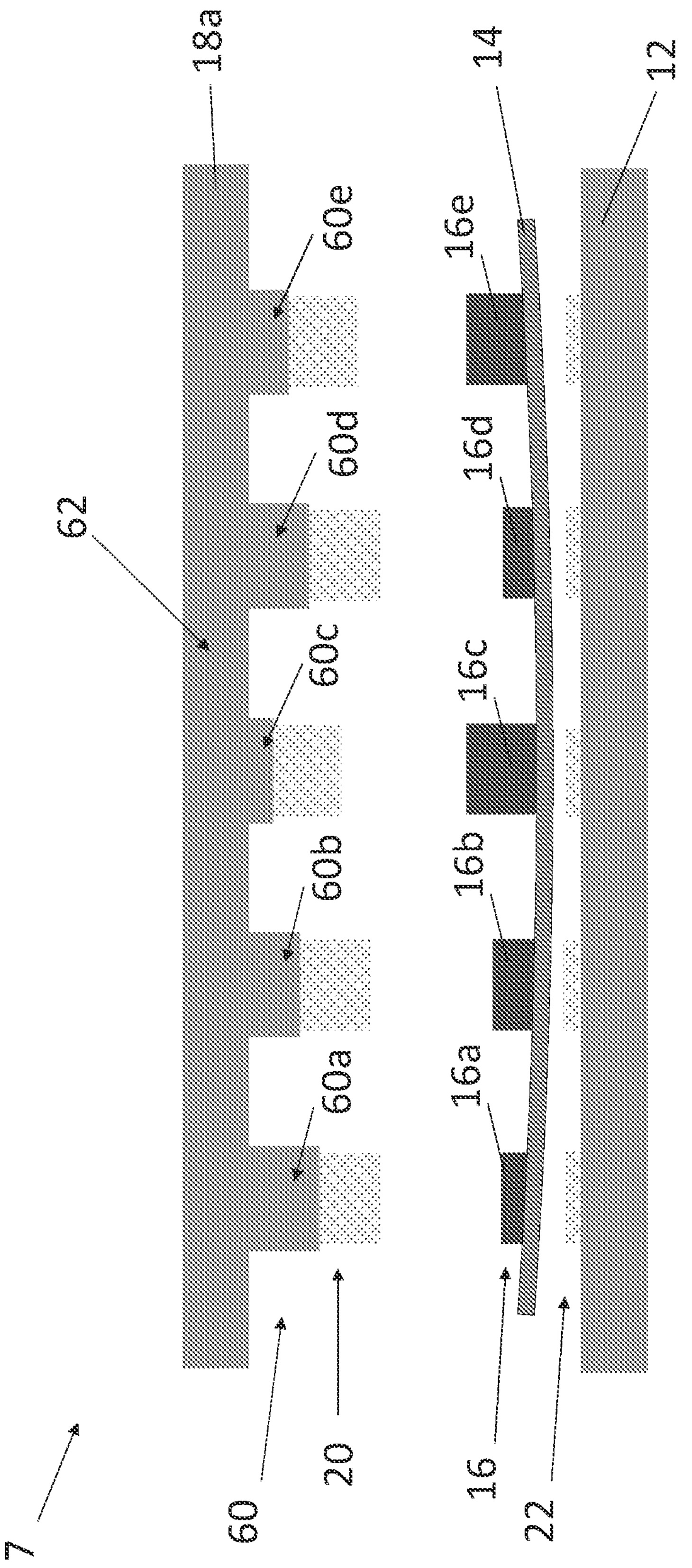
FIG. 6A shows a schematic cross sectional side view of a SoW assembly that includes a cooling system with a height adjustment structure prior to coupling the cooling system with VRMs on a SoW, according to an embodiment.
Figure 6B:
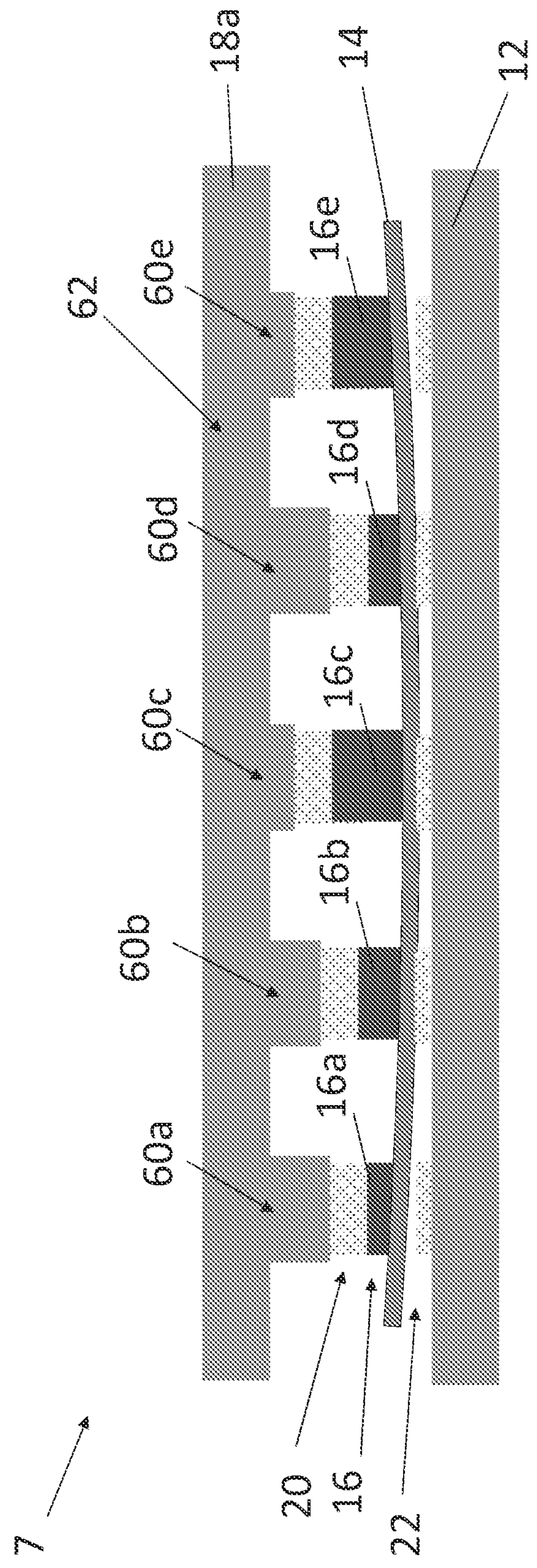
FIG. 6B shows a schematic cross sectional side view of the SoW assembly of FIG. 6A after coupling the cooling system with the first group of VRMs on the SoW.

FIG. 6A shows a schematic cross sectional side view of a SoW assembly 7 that includes a cooling system **18*a* with a height adjustment structure 60 prior to coupling the cooling system 18*a* with VRMs 16 on a SoW 14, according to an embodiment. FIG. 6B shows a schematic cross sectional side view of the SoW assembly 7 after coupling the cooling system 18***a* with the first group of VRMs 36 on the SoW 14. FIGS. 6A and 6B illustrate features of an embodiment where a height adjustment structure 60 extends from the cooling system 18*a* to compensate for variation in height of VRMs 16. Unless otherwise noted, components of the SoW assembly 7 of FIGS. 6A and 6B can be the same as or generally similar to like components of any SoW assembly disclosed herein.

The SoW assembly 7 can include a heat dissipation structure 12 and the SoW 14 positioned over the heat dissipation structure 12. The heat dissipation structure 12 and the SoW 14 can have a TIM 22 positioned therebetween. The SoW assembly 7 can include the VRMs 16 positioned over the SoW 14, and the cooling system 18*a* positioned over the VRMs 16. The VRMs 16 and the cooling system 18*a* can have a TIM 20 positioned therebetween.

In some embodiments, as shown in FIGS. 6A and 6B, the cooling system 18*a* can comprise the height adjustment structure 60. The height adjustment structure 60 can include first to fifth protrusions 60*a*-60*e* that extend from a flat portion 62 of the cooling system 18*a*, in the illustrated embodiment. The protrusions 60*a*-60*e* can be referred to as pedestals. In some other embodiments, the height adjustment structure 60 can be separately formed from the cooling system 18*a*. In some embodiments, the height adjustment structure 60 can comprise a trench or groove formed in the flat portion 62 of the cooling system 18*a*. In some embodiments, the height adjustment structure 60 can comprise a combination of one or more protrusions and one or more trenches.

In the SoW assembly 7, the VRMs 16 can have different heights. During a coupling process for coupling the cooling system 18*a* with the VRMs 16 on the SoW 14, the height adjustment structure 60 of the cooling system 18*a* can compensate for the VRM height differences to make the distribution of compression force applied to the SoW 14 more even. This can reduce the risk of damaging the SoW 14 during the coupling process. In addition, the this can reduce a difference in thickness between TIM 20 between different VRMs 16 and the cooling system 18.

When the heat dissipation structure 12 and the cooling system 18*a* of the SoW assembly 7 are brought together to be coupled to one another, generally uniform, equal, or almost equal compression force can be applied to each one of the first to fifth VRMs 16*a*-16*e*, the first to fifth protrusions 60*a*-60*e*, and each corresponding TIM 20. Such generally uniform, equal, or almost equal compression force can mitigate risks of the SoW 14 being damaged.

In some embodiments, a protrusion of the height adjustment structure 60 can be omitted adjacent to one or more of the tallest VRM(s) of the first to fifth VRMs 16*a*-16*e*. In some embodiments, the height of the first to fifth protrusions 60*a*-60*e* can be determined based at least in part on the height differences between the heights of the first to fifth VRMs 16*a*-16*e*. In some embodiments, two or more separate height adjustment structures can be provided for a VRM between the SoW 14 and the cooling system 18, 18*a*. For example, a combination of the height adjustment structure 60 and the height adjustment structure 50 can be included in a SoW assembly.

Figure 7A:
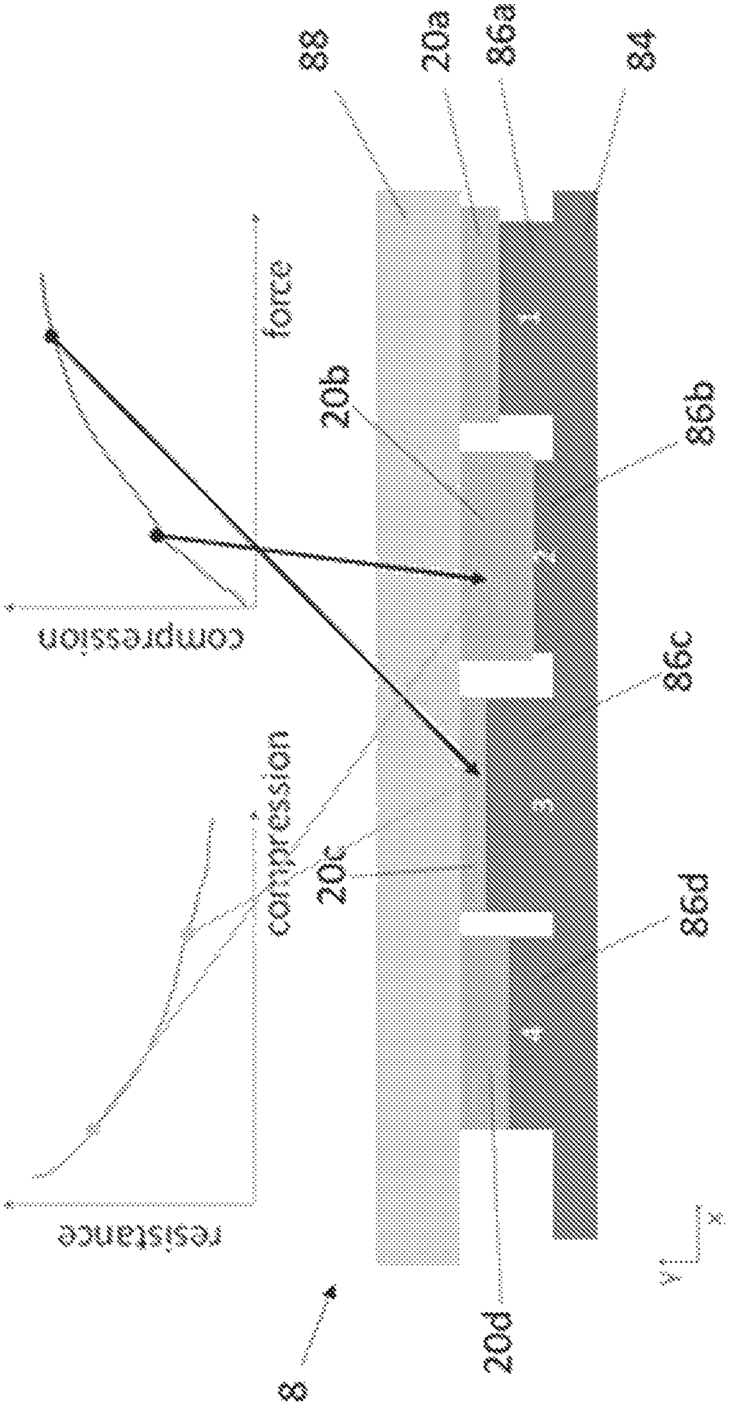
FIG. 7A shows a schematic cross sectional side view of a SoW assembly and graphs showing measurement results associated with the SoW assembly.

FIG. 7A shows a schematic cross sectional side view of a SoW assembly 8. The SoW assembly 8 includes a wafer 84, first to forth VRMs 86*a*-86*d* positioned on the wafer 84, a cooling system 88, and first to forth TIMs 20*a*-20*d* positioned between the first to forth VRMs 86*a*-86*d* and the cooling system 88. FIG. 7A also includes a graph showing a compression pressure measured between the wafer 84 and the cooling system 88 on the x-axis and a resistance on the y-axis, and a graph showing a force applied to the cooling system 88 on the x-axis and a compression pressure measured between the wafer 84 and the cooling system 88 on the y-axis.

Figure 7B:
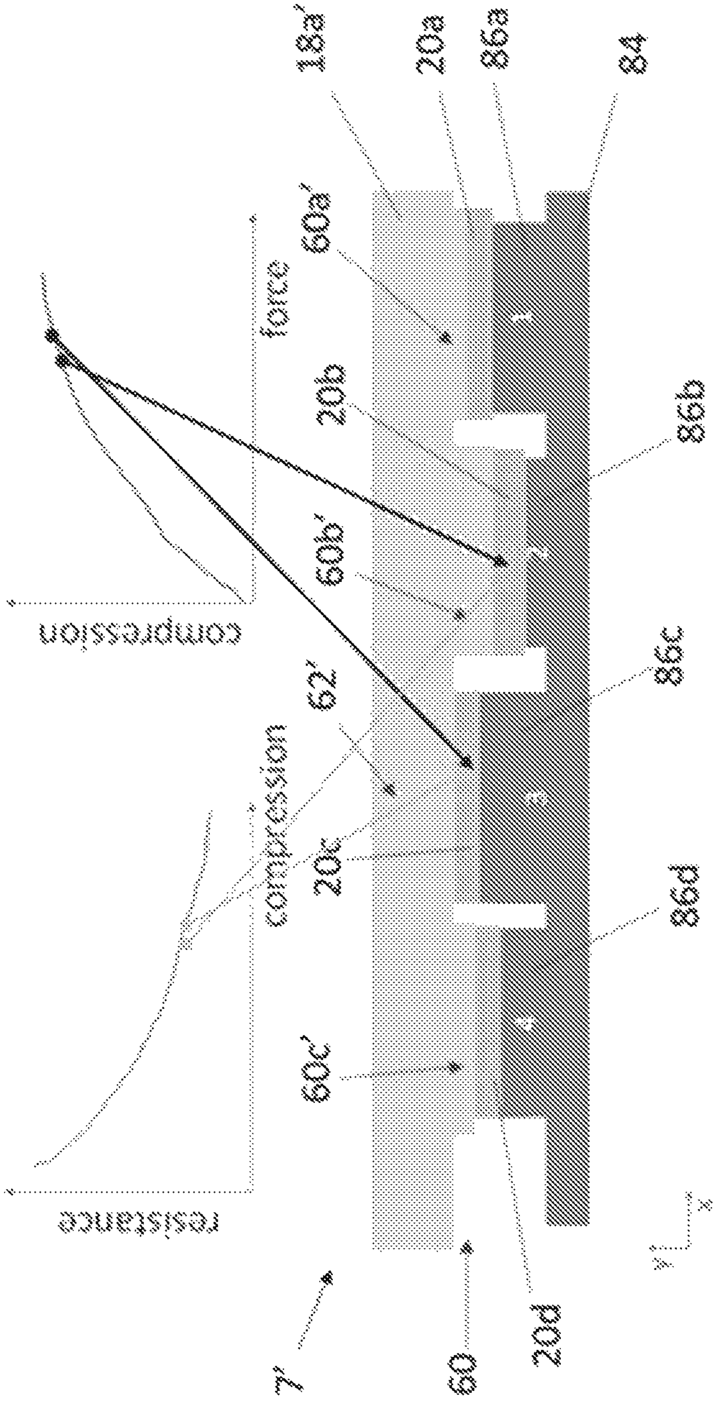
FIG. 7B shows a schematic cross sectional side view of a SoW assembly according to an embodiment and graphs showing measurement results associated with the SoW assembly.

FIG. 7B shows a schematic cross sectional side view of a SoW assembly 7' according to an embodiment. The SoW assembly 7' includes a wafer 84, first to forth VRMs 86*a*-86*d* positioned on the wafer 84, a cooling system 18*a*', and first to forth TIMs 20*a*-20*d* positioned between the first to forth VRMs 86*a*-86*d* and the cooling system 18*a*'. The cooling system 18*a*' can include a height adjustment structure 60'. The height adjustment structure 60' can include a first to third protrusions 60*a*'-60*c*' that protrude from a flat portion 62' of the cooling system 18'. Unless otherwise noted, components of the SoW assembly 7' of FIG. 7B can be the same as or generally similar to like components of any SoW assembly disclosed herein. FIG. 7B also includes a graph showing a compression pressure measured between the wafer 84 and the cooling system 18*a*' on the x-axis and a resistance on the y-axis, and a graph showing a force applied to the cooling system 18*a*' on the x-axis and a compression pressure measured between the wafer 84 and the cooling system 18*a*' on the y-axis.

In the SoW assembly 8 illustrated in FIG. 7A, the compression pressure experienced by the third TIM 20*c* is significantly higher than the compression pressure experienced by the second TIM 20*b*. The different compression pressures measured in these two TIMs 20*b*, 20*c* can be due to the difference in spacings between the cooling system 88 and the second VRM 86*b* and the cooling system 88 and the third VRM 86*c*. By contrast, in the SoW assembly 7', the compression pressure experienced by the third TIM 20*c* and the compression pressure experienced by the second TIM 20*b* are generally similar. It can be observed that the second protrusion 60*b*' contributed to make the compression pressure experienced by the third TIM 20*c* and the compression pressure experienced by the second TIM 20*b* to be generally similar. By making a spacing for a TIM at each VRM on a wafer the same or generally similar by utilizing any suitable principles and advantages disclosed herein, force applied to the wafer through the VRMs can have less variation and be more evenly distributed so as to prevent or mitigate the wafer from being damaged.

Figure 8:
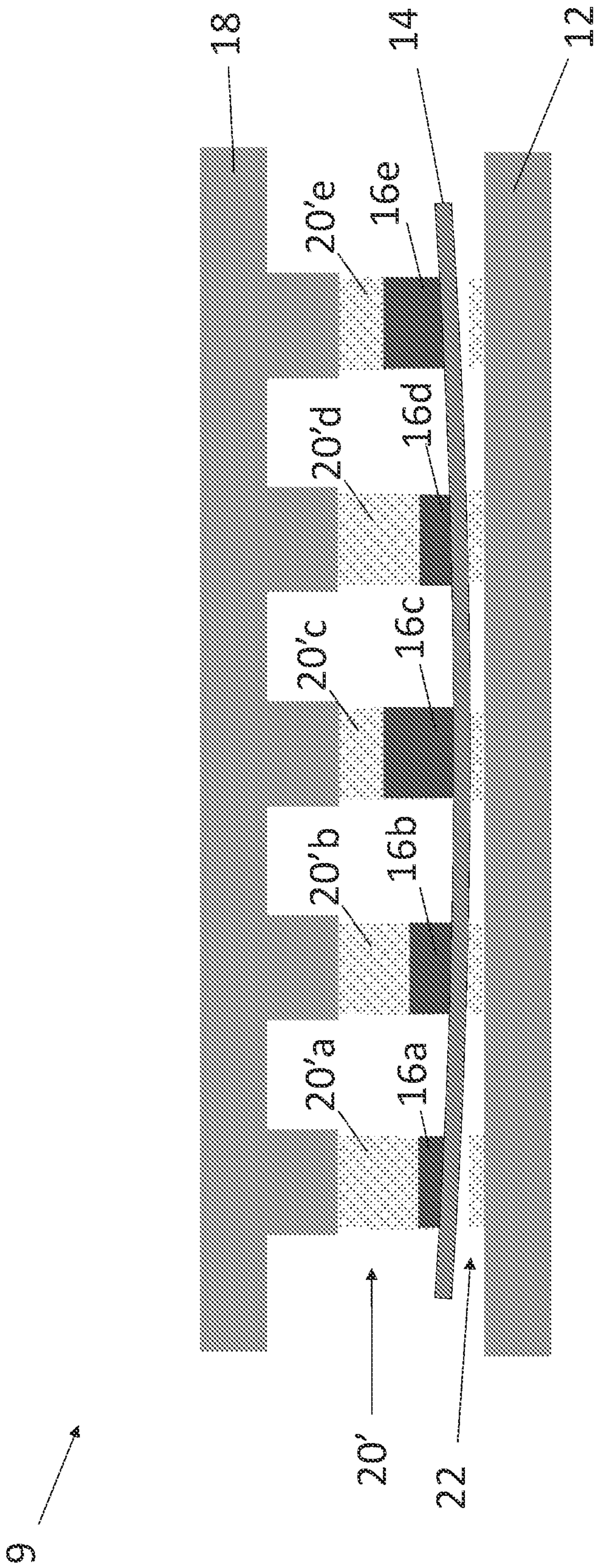
FIG. 8 shows a schematic cross sectional side view of a SoW assembly that includes a cooling system coupled with VRMs on a SoW by differently sized thermal interface material (TIM) layers.

FIG. 8 shows a schematic cross sectional side view of a SoW assembly 9 that includes a cooling system 18 coupled with VRMs 16*a*-16*e* on a SoW 14 by differently sized TIM layers 20'. The differently sized TIM layers 20' can have different thicknesses to compensate for variation in VRM heights. The differently sized TIM layers 20' can include a first to fifth TIM layers 20'*a*-20'*e*. Unless otherwise noted, components of the SoW assembly 9 of FIG. 8 can be the same as or generally similar to like components of any other suitable SoW assembly disclosed herein.

The differently sized TIM layers 20' (the first to fifth TIM layers 20'*a*-20'*e*) can be provided over the first to fifth VRMs 16*a*-16*e* that have different heights and act as a height adjustment structure. For example, a thinner TIM layer can be provided with a thicker VRM among the VRMs 16*a*-16*e*, and a thicker TIM layer can be provided for a thinner VRM among the VRMs 16*a*-16*e*. This can adjust total thicknesses of the first to fifth VRMs 16*a*-16*e* and the respective first to fifth TIM layers 20'*a*-20'*e* to be the same or generally similar. The portion of the thicker TIM can be a height adjustment structure that compensates for a difference in VRM heights. In some embodiments, one or more of the first to fifth TIM layers 20'$a$-20'$e$ can have separate portions. For example, the first TIM layer 20'$a$ can have two or more portions that can be intervened by an intervening layer (not shown). The sum of the thicknesses of two or more portions can define the thickness of the first TIM layer 20'$a$.

When the heat dissipation structure 12 and the cooling system 18 of the SoW assembly 9 are brought together to be coupled to one another, generally uniform, equal, or almost equal compression force can be applied to each one of the first to fifth VRMs 16$a$-16$e$ and each corresponding one of the differently sized TIM layers 20'. Such generally uniform, equal, or almost equal compression force can mitigate risks of the SoW 14 being damaged from coupling the cooling system 18 to the SoW 14. After the SoW 14 and the cooling system 18 are coupled together, the differently sized TIM layers 20' can have the same or generally similar densities, and/or footprints.

Any suitable principles and advantages disclosed herein can be applicable to wafer level packaging and/or high density multiple die packaging. Though the embodiments disclosed herein used VRMs as an example, any suitable electrical module, component, die, chip, or the like may be mounted on a wafer and utilize any suitable principles and advantages disclosed herein. Any suitable combination of features of two or more embodiments disclosed herein can be implemented. For example, a SoW module can have any suitable combination of the select and mount features described with respect to FIG. 3, binning features described with respect to FIGS. 4A-4D, the height adjustment features described with respect to FIGS. 5A-5C, or the height adjustment features described with respect to FIGS. 6A-6B.

The SoW assemblies disclosed herein can be included in a processing system. Features of this disclosure, such as any of the techniques to reduce uneven pressure applied to a wafer, can be implemented in any suitable processing system. The processing system can have a high compute density and can dissipate heat generated by the processing system. The processing system can execute trillions of operations per second in certain applications. The processing system can be used in and/or specifically configured for high performance computing and/or computation intensive applications, such as neural network training and/or processing, machine learning, artificial intelligence, or the like. The processing system can implement redundancy. In some applications, the processing system can be used for neural network training to generate data for an autopilot system for vehicle (e.g., an automobile), other autonomous vehicle functionality, or Advanced Driving Assistance System (ADAS) functionality.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments.

The foregoing description has been described with reference to specific embodiments. However, the illustrative discussions above are not intended to be exhaustive or to limit the inventions to the precise forms described. Many modifications and variations are possible in view of the above teachings. Others skilled in the art are thereby enabled to best utilize the techniques and various embodiments with various modifications as suited to various uses.

Although the disclosure and examples have been described with reference to the accompanying drawings, various changes and modifications will become apparent to those skilled in the art. Such changes and modifications are to be understood as being included within the scope of the disclosure.

What is claimed is:

1. A wafer assembly comprising:

a cooling system;

a wafer;

a first electronic module mounted on a first location of the wafer and coupled to a first portion of the cooling system, the first electronic module and the first portion of the cooling system positioned such that a first thermal interface material (TIM) is disposed between the first electronic module and the first portion of the cooling system;

a second electronic module mounted on a second location of the wafer different from the first location and coupled to a second portion of the cooling system, the second electronic module and the second portion of the cooling system positioned such that a second TIM is disposed between the second electronic module and the second portion of the cooling system, wherein the wafer is curved such that the first location is a different distance from the cooling system than the second location; and a height adjustment structure disposed between the first location of the wafer and the first portion of the cooling system, the height adjustment structure configured to compensate for a height difference between the first electronic module and the second electronic module.

2. The wafer assembly of claim 1, wherein the first electronic module is a voltage regulating module (VRM).

3. The wafer assembly of claim 1, wherein the height adjustment structure comprises a crown disposed on the first electronic module.

4. The wafer assembly of claim 1, wherein the height adjustment structure comprises a protrusion extending from the first portion of the cooling system.

5. The wafer assembly of claim 1, further comprising a second height adjustment structure disposed between the second location of the wafer and the second portion of the cooling system, wherein a height of the second height adjustment structure is different from a height of the first height adjustment structure.

6. The wafer assembly of claim 1, wherein the height adjustment structure comprises part of the first TIM.

7. The wafer assembly of claim 1, further comprising a heat dissipation structure positioned such that the wafer is located between the cooling system and the heat dissipation structure.

8. A wafer assembly comprising:

a wafer having a center region and an edge region around the center region;

a plurality of electronic modules having different heights mounted on the wafer such that an average height of a first group of electronic modules of the plurality of electronic modules located within the center region is greater than an average height of a second group of electronic modules of the plurality of electronic modules located within the edge region; and a cooling system coupled to the plurality of electronic modules, the cooling system and the plurality of electronic modules positioned such that a thermal interface material (TIM) is disposed between the cooling system and the plurality of electronic modules, wherein the wafer is curved such that the edge region of the wafer is closer to the cooling system than the center region of the wafer.

9. The wafer assembly of claim 8, wherein the first group of electronic modules have heights that are greater than heights of the second group of electronic modules.

10. The wafer assembly of claim 8, further comprising a heat dissipation structure positioned such that the wafer is located between the cooling system and the heat dissipation structure.

11. The wafer assembly of claim 8, wherein the plurality of electronic modules comprise a plurality of voltage regulating modules (VRMs).

12. A method of manufacturing wafer assemblies, the method comprising:

selecting a first group of electronic modules and a second group of electronic modules from a plurality of electronic modules such that a height variation of the first group of electronic modules and a height variation of the second group of electronic modules are both less than a height variation of the plurality of electronic modules;

mounting the first group of electronic modules on a first wafer and the second group of electronic modules on a second wafer;

coupling a first cooling system and the first group of electronic modules such that a first thermal interface material is positioned between the first cooling system and the first group of electronic modules; and coupling a second cooling system and the second group of electronic modules such that a second thermal interface material is positioned between the second cooling system and the second group of electronic modules.

13. The method of claim 12, wherein the plurality of electronic modules comprise a plurality of voltage regulating modules (VRMs).

14. The method of claim 12, wherein the first wafer comprises integrated circuit dies aligned with corresponding ones of the first group of electronic modules.

15. The method of claim 12, wherein the height variation of the first group of electronic modules and the height variation of the second group of electronic modules are each less than half of the height variation of the plurality of electronic modules.

16. The method of claim 12, wherein the coupling the first cooling system and the first group of electronic modules comprises applying force to the first cooling system to compress the first thermal interface material.

17. The method of claim 12, further comprising providing a first heat dissipation structure such that the first wafer is positioned between the first cooling system and the first heat dissipation structure.

18. The method of claim 17, further comprising:

securing the first heat dissipation structure and the first cooling system with a first fastener; and securing a second heat dissipation structure and the second cooling system with a second fastener, wherein the second fastener is longer than the first fastener.

19. The method of claim 12, further comprising:

selecting a third group of electronic modules from the plurality of electronic modules such that a height variation of the third group of electronic modules is less than the height variation of the plurality of electronic modules;

mounting the third group of electronic modules on a third wafer; and coupling a third cooling system and the third group of electronic modules such that a third thermal interface material is positioned between the third cooling system and the third group of electronic modules.

20. The method of claim 12, wherein mounting the first group of electronic modules on the first wafer comprises:

mounting a first sub-group of the first group of electronic modules within a center region of the first wafer; and mounting a second sub-group of the first group of electronic modules within an edge region of the first wafer that is around the center region, wherein the first sub-group of electronic modules has an average height that is greater than an average height of the second sub-group of electronic modules, and wherein the first wafer is curved such that the edge region is spaced apart from the cooling system by a smaller distance than the center region.

* * * * *